United States Patent
Menon et al.

(10) Patent No.: US 12,161,009 B2
(45) Date of Patent: Dec. 3, 2024

(54) ORGANIC ELECTROLUMINESCENT DEVICES

(71) Applicant: Universal Display Corporation, Ewing, NJ (US)

(72) Inventors: Vinod M. Menon, New York, NY (US); Michael Fusella, Lawrenceville, NJ (US); Nicholas J. Thompson, New Hope, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 18/240,942

(22) Filed: Aug. 31, 2023

(65) Prior Publication Data

US 2023/0413596 A1    Dec. 21, 2023

Related U.S. Application Data

(63) Continuation of application No. 17/564,315, filed on Dec. 29, 2021, now Pat. No. 11,793,015, which is a continuation of application No. 16/814,256, filed on Mar. 10, 2020, now Pat. No. 11,245,086.

(60) Provisional application No. 62/817,424, filed on Mar. 12, 2019.

(51) Int. Cl.
| | |
|---|---|
| *H01L 51/50* | (2006.01) |
| *H10K 50/822* | (2023.01) |
| *H10K 50/85* | (2023.01) |
| *H10K 50/115* | (2023.01) |

(52) U.S. Cl.
CPC ........... *H10K 50/822* (2023.02); *H10K 50/85* (2023.02); *H10K 50/115* (2023.02)

(58) Field of Classification Search
CPC .................................................. H10K 50/822
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,703,436 A | 12/1997 | Forrest | |

(Continued)

FOREIGN PATENT DOCUMENTS

| | | | |
|---|---|---|---|
| CN | 105789478 A | 7/2016 | |
| CN | 107464826 A | 12/2017 | |

(Continued)

OTHER PUBLICATIONS

European Patent Office Communication pursuant to Article 94(3) EPC issued in App. No. EP20162534, dated Jul. 11, 2022, 11 pages.

(Continued)

*Primary Examiner* — Anthony Ho
(74) *Attorney, Agent, or Firm* — Butzel Long

(57) ABSTRACT

Embodiments of the disclosed subject matter provide a device including one or more organic layers that include an emissive layer, a first electrode layer disposed over the one or more organic layers, a plurality of nanostructures formed as part of the first electrode layer, a substrate, a second electrode layer, where the second electrode layer is disposed on the substrate, the one or more organic layers are disposed on the second electrode layer, and the first electrode layer including the plurality of nanostructures is disposed on the one or more organic layers and within the predetermined threshold distance of the emissive layer.

19 Claims, 11 Drawing Sheets

(56) References Cited

U.S. PATENT DOCUMENTS

| | | | |
|---|---|---|---|
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 9,960,386 | B2 | 5/2018 | Thompson |
| 11,245,086 | B2 | 2/2022 | Menon |
| 2003/0230980 | A1 | 12/2003 | Forrest |
| 2004/0174116 | A1 | 9/2004 | Lu |
| 2005/0035346 | A1 | 2/2005 | Bazan |
| 2010/0127287 | A1 | 5/2010 | Mao |
| 2013/0153861 | A1 | 6/2013 | Kaminska |
| 2016/0126488 | A1 | 5/2016 | Copner |
| 2017/0229663 | A1 | 8/2017 | Tsai |
| 2017/0299784 | A1 | 10/2017 | Mikkelsen |
| 2018/0083219 | A1 | 3/2018 | Copner |

FOREIGN PATENT DOCUMENTS

| | | |
|---|---|---|
| WO | 2008057394 A1 | 5/2008 |
| WO | 2010011390 A2 | 1/2010 |
| WO | 2018111974 A2 | 6/2018 |

OTHER PUBLICATIONS

Vincent Reboud et al: "Enhanced light extraction in ITO-free OLEDs using double-sided printed electrodes", Nanoscale, vol. 4, No. 11, Jun. 1, 2012 (Jun. 1, 2012), pp. 3495-3500.

Leiming Wang: "Simulating Plasmon Effect in Nanostructured OLED Cathode Using Finite Element Method", Jan. 1, 2016 (Jan. 1, 2016), XP055709014, Retrieved from the Internet: URL: https://pdfs.semanticscholar.org/563e/79517e9bee8ab68bcf96e777a4bb0574ce08.pdf [retrieved on Jun. 26, 2020].

Lee Sung-Min et al: "A Review of Flexible OLEDs Toward Highly Durable Unusual Displays", IEEE Transactions on Electron Devices, IEEE, USA, vol. 64, No. 5, May 1, 2017 (May 1, 2017), pp. 1922-1931, XP011646238, ISSN: 0018-9383, DOI: 10.1109/TED. 2017.2647964 [retrieved on Apr. 20, 2017].

Baldo et al. "Highly efficient phosphorescent emission from organic electroluminescent devices", Nature, vol. 395, pp. 151-154, 1998.

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Schulze et al: "Efficient Vacuum-Deposited Organic Solar Cells Based on a New Low-Bandgap Oligothiophene and Fullerene C60", Advanced Materials, vol. 18, No. 21,Nov. 3, 2006 (Nov. 3, 2006), pp. 2872-2875.

Kevin C.Y. Huang et al: "Antenna electrodes for controlling electroluminescence", Nature Communications, vol. 3, Aug. 14, 2012 (Aug. 14, 2012), p. 1005.

European Patent Office Search Report for App. No. EP20162534.0, Sep. 30, 2020, 8 pages.

Schubert et al: "Unusually High Optical Transmission in Ca:Ag Blend Films:High-Performance Top Electrodes for Efficient Organic Solar Cells", Advanced Functional Materials, vol. 24, No. 42, Nov. 1, 2014 (Nov. 1, 2014), pp. 6668-6676, XP055719434, DE ISSN: 1616-301X, DOI: 10.1002/adfm.201401854.

Chinese Office Action issued in App. No. CN202010171740, dated May 29, 2024, 13 pages.

FIGS. 4A-4H
FIG. 4A
1D grating
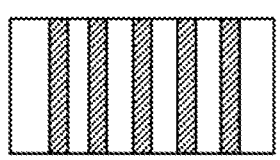
FIG. 4B
Triangular lattice
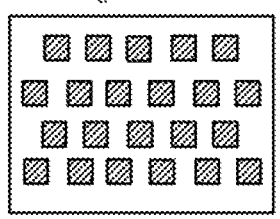
FIG. 4C
Quasi-periodic lattice
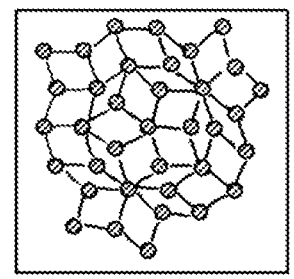
Square lattice
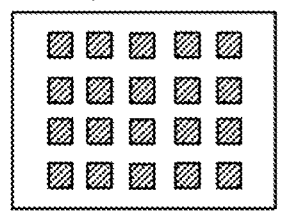
Hexagonal lattice
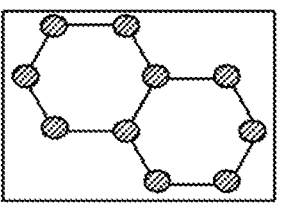
Random Lattice
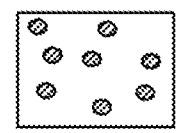
FIG. 4D  FIG. 4E  FIG. 4F
Arrays of grouped particles
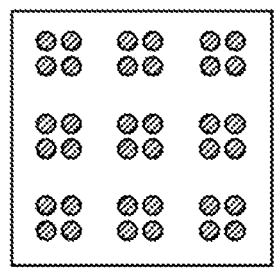 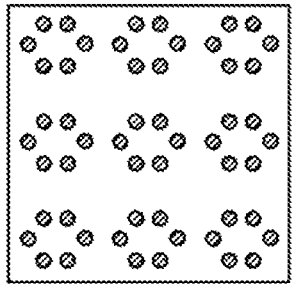
FIG. 4G  FIG. 4H

ORGANIC ELECTROLUMINESCENT DEVICES

CROSS-REFERENCE TO RELATED APPLICATIONS

This application is a continuation of U.S. patent application Ser. No. 17/564,315, filed Dec. 29, 2021, which is a continuation of U.S. patent application Ser. No. 16/814,256 filed Mar. 10, 2020, and which claims priority to U.S. Patent Application Ser. No. 62/817,424, filed Mar. 12, 2019, the entire contents of each are incorporated herein by reference.

FIELD

The present invention relates to nanostructures to increase emission rates and/or out-coupling, improve device stability, and/or provide a far-field radiation pattern.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device may include one or more organic layers that have an emissive layer, a first electrode layer disposed over the one or more organic layers, a plurality of nanostructures formed as part of the first electrode layer, a substrate, and a second electrode layer, where the second electrode layer is disposed on the substrate, the one or more organic layers are disposed on the second electrode layer, and the first electrode layer including the plurality of nanostructures is disposed on the one or more organic layers and within the predetermined threshold distance of the emissive layer.

At least a portion of the first electrode layer may be at least one of Ag, Al, Au, Ir, Pt, Ni, Cu, W, Ta, Fe, Cr, Mg, Ga, Rh, Ti, Ru, Pd, In, Bi, and/or Ca. These may be included in an alloy, a mixture, and/or a stack in a portion of the first electrode layer. The plurality of nanostructures may be nanoholes through a thickness of the first electrode layer. The device may include a dielectric layer, where the dielectric layer is disposed on the first electrode layer including the plurality of nanostructures. The dielectric layer may be one or more of organic, titania, silicon dioxide, silicon nitride, aluminum oxide, zinc oxide, nickel oxide, germanium oxide, lithium fluoride, magnesium fluoride, and/or molybdenum oxide.

The plurality of nanostructures of the device may be nanoholes having a predetermined depth that is less than a thickness of the first electrode layer. The device may include a dielectric layer, where the dielectric layer is disposed on the first electrode layer including the plurality of nanostructures. The plurality of nanostructures may be nanoholes, where one or more of the nanoholes are through a thickness of the first electrode layer, and the other nanoholes have a predetermined depth that is less than a thickness of the first electrode layer. The device may include a dielectric layer, where the dielectric layer is disposed on the first electrode layer including the plurality of nanostructures.

At least a portion of the second electrode layer of the device may be at least one of Ag, Al, Au, Ir, Pt, Ni, Cu, W, Ta, Fe, Cr, Mg, Ga, Rh, Ti, Ru, Pd, In, Bi, Ca, titania, silicon dioxide, silicon nitride, aluminum oxide, zinc oxide, nickel oxide, germanium oxide, lithium fluoride, molybdenum oxide, and/or a transparent conducting oxide. The plurality of nanostructures of the device may include at least one of a periodic array of holes, a random array of holes, and a quasi-periodic array of holes in the first electrode layer. The plurality of nanostructures may be configured such that resonance generated by electromagnetic modes in the holes couples to propagating surface plasmons of the first electrode layer. The plurality of nanostructures may include an array of holes which provides a grating for out-coupling surface plasmon energy as light.

The surface plasmon modes of the device may couple to dipole moments that are within 30 degrees of parallel to a plane of the first electrode layer. The surface plasmon modes of the plurality of nanostructures on the first electrode layer may couple to a dipole of the emitting layer that is oriented parallel to the first electrode layer. The surface plasmon modes may couple to dipole moments that are within 10 degrees of parallel to a plane of the first electrode layer.

The plurality of nanostructures of the device may include a through hole in the first electrode layer, surrounded by a concentric ring grating structure. The concentric ring grating structure of the device may provide an out-coupling, and the through hole may set a resonance of an electromagnetic mode. The plurality of nanostructures may include at least one through hole in the first electrode layer. The plurality of nanostructures may be etched on the first electrode layer, and may have an etch depth in the range of 1 nm to a thickness of the first electrode layer. The plurality of nanostructures may at least one of metals, semiconductors, and/or dielectrics.

A radius of curvature in an x, y, or z direction of a shape of the plurality of nanostructures of the device may tune a resonant frequency of the nanostructures. The plurality of nanostructures may be disposed in an array arrangement of periodic arrays, quasi-periodic arrays, and/or aperiodic arrays to form electromagnetic modes arising from the electromagnetic coupling between the individual nanostructures. When the plurality of nanostructures of the device are in the array arrangement, a pitch may range from 100 nm to 1 μm. The periodic array may be at least one of a square mesh, a hexagonal mesh, a triangular mesh, and/or a one-dimensional grating. Nodes of the mesh include an individual nanostructure or a grouping of nanostructures having a predetermined spacing selected from the group consisting of: square arrays, hexagonal arrays, quasi-periodic, and random arrays. The plurality of nanostructures in the aperiodic arrays may have a random arrangement. A size of each of the plurality of nanostructures may be 5 nm to 400 nm. A refractive index surrounding the first electrode of the device may adjustable by including liquid crystals or phase-changing materials.

BRIEF DESCRIPTION OF THE DRAWINGS

FIGS. 4A-4H shows example nanostructure arrays and configurations, as represented by the hatched areas, according to an embodiment of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
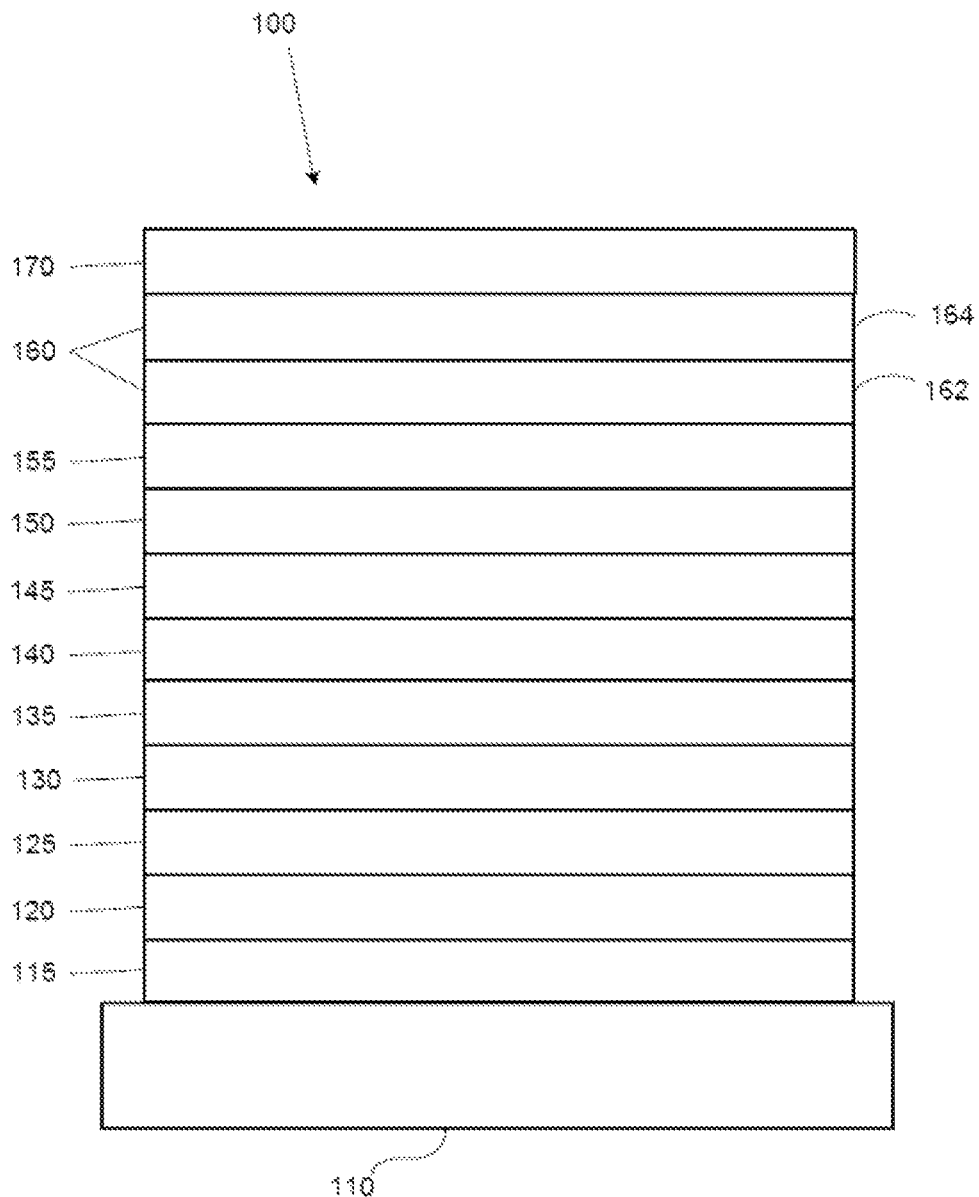
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
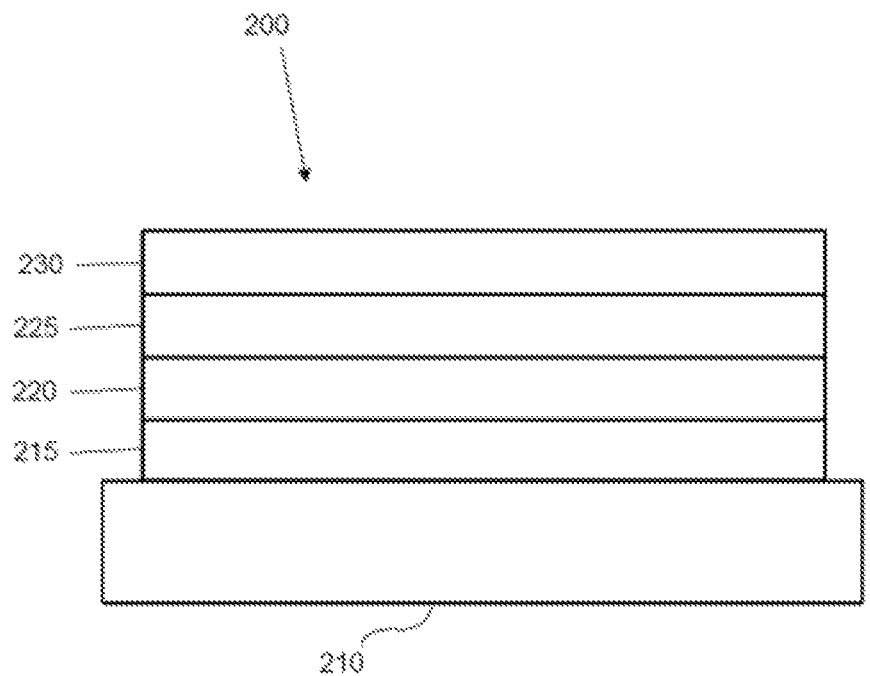
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Embodiments of the disclosed subject matter provide improved organic light emitting diode (OLED) performance by using nanostructures having one or more different geometries, shapes, materials, and/or lattice symmetries. The nanostructures may enhance emission rates, increase surface plasmon polariton (SPP) mode out-coupling, improve device stability, and/or provide a far-field radiation pattern.

For efficient coupling of an excited state energy into a plasmon mode, an emitter or emissive layer may be placed within a threshold distance of a structure and/or layer(s) that increase the photonic density of states (as shown in FIGS. 3A-3F), subsequently resulting in an enhanced emission rate known as the Purcell effect. The threshold distance may be a distance at which the total non-radiative decay rate constant is equal to the total radiative decay rate constant, consistent with U.S. Pat. No. 9,960,386, the disclosure of which is incorporated by reference in its entirety.

Figure 3A:
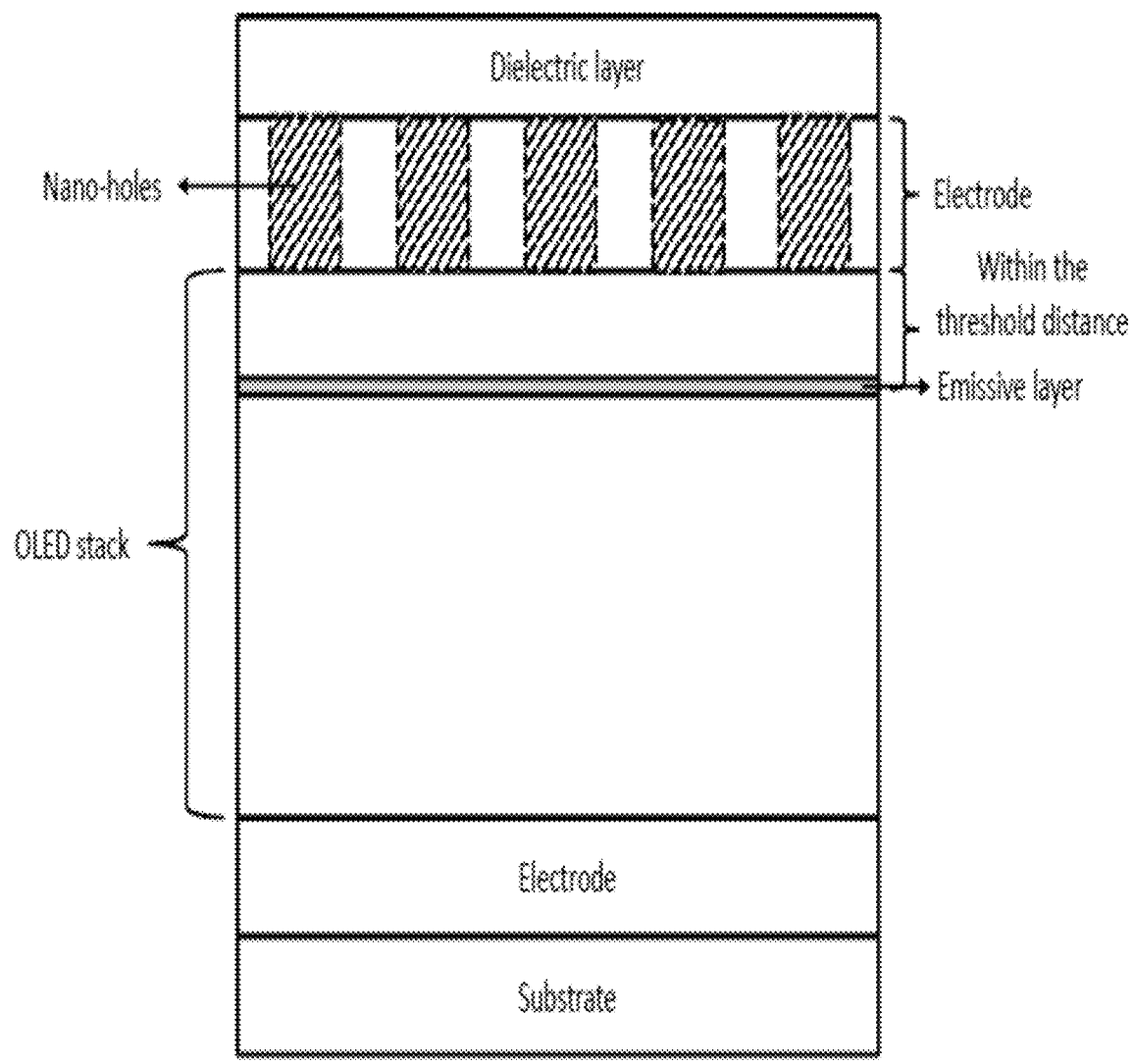
FIG. 3A-3F show example OLED devices with various nanostructures, either with or without a dielectric capping layer, according to embodiments of the disclosed subject matter.
Figure 3B:
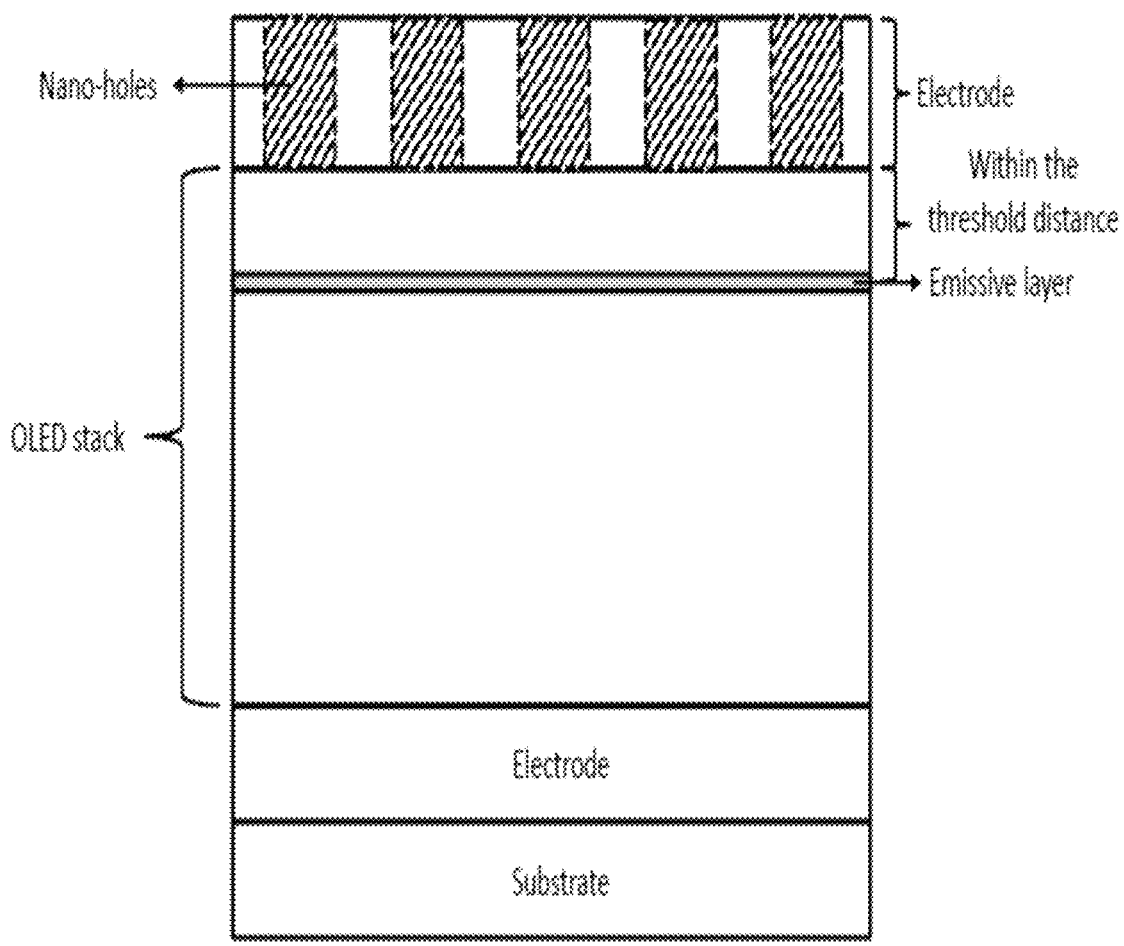
Figure 3C:
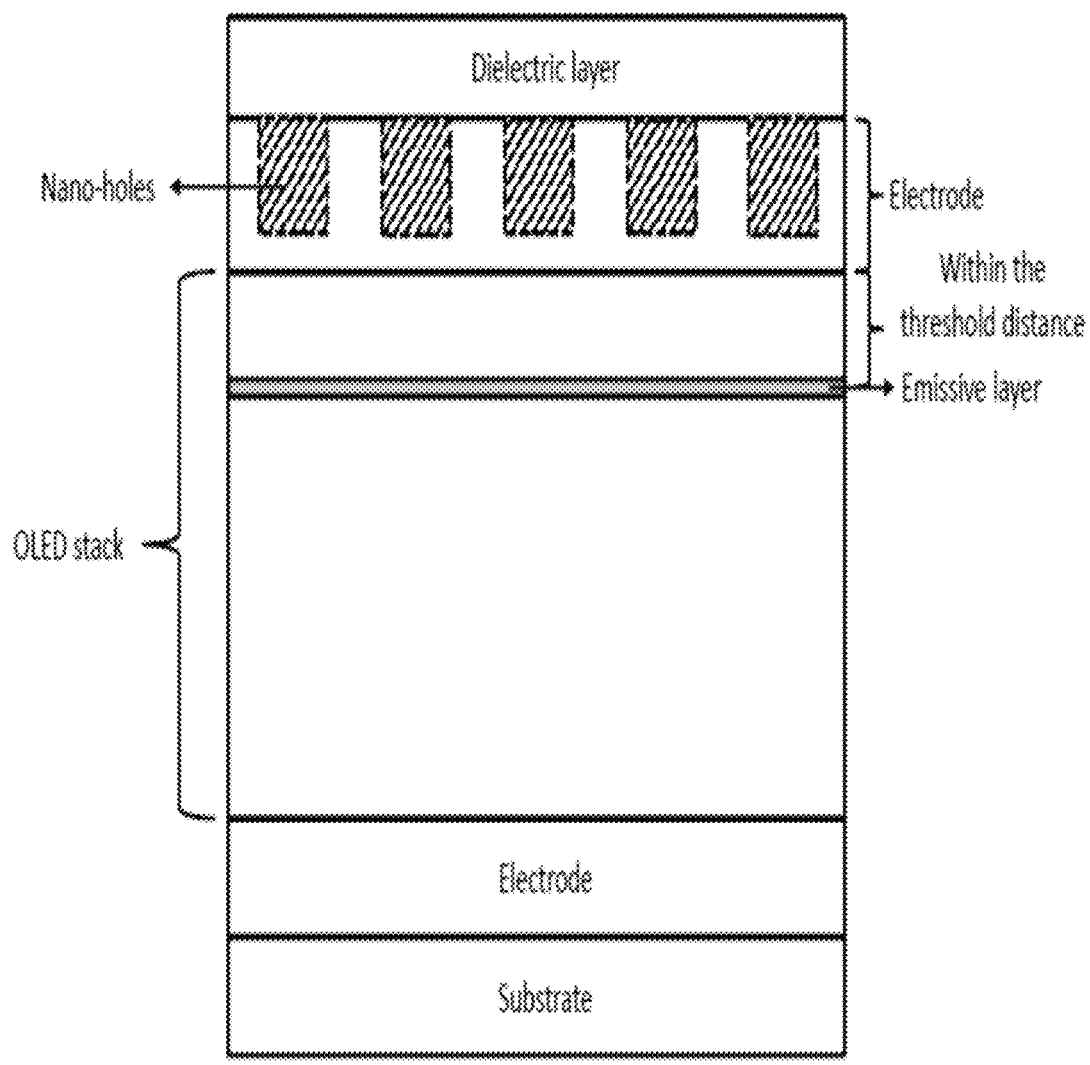
Figure 3D:
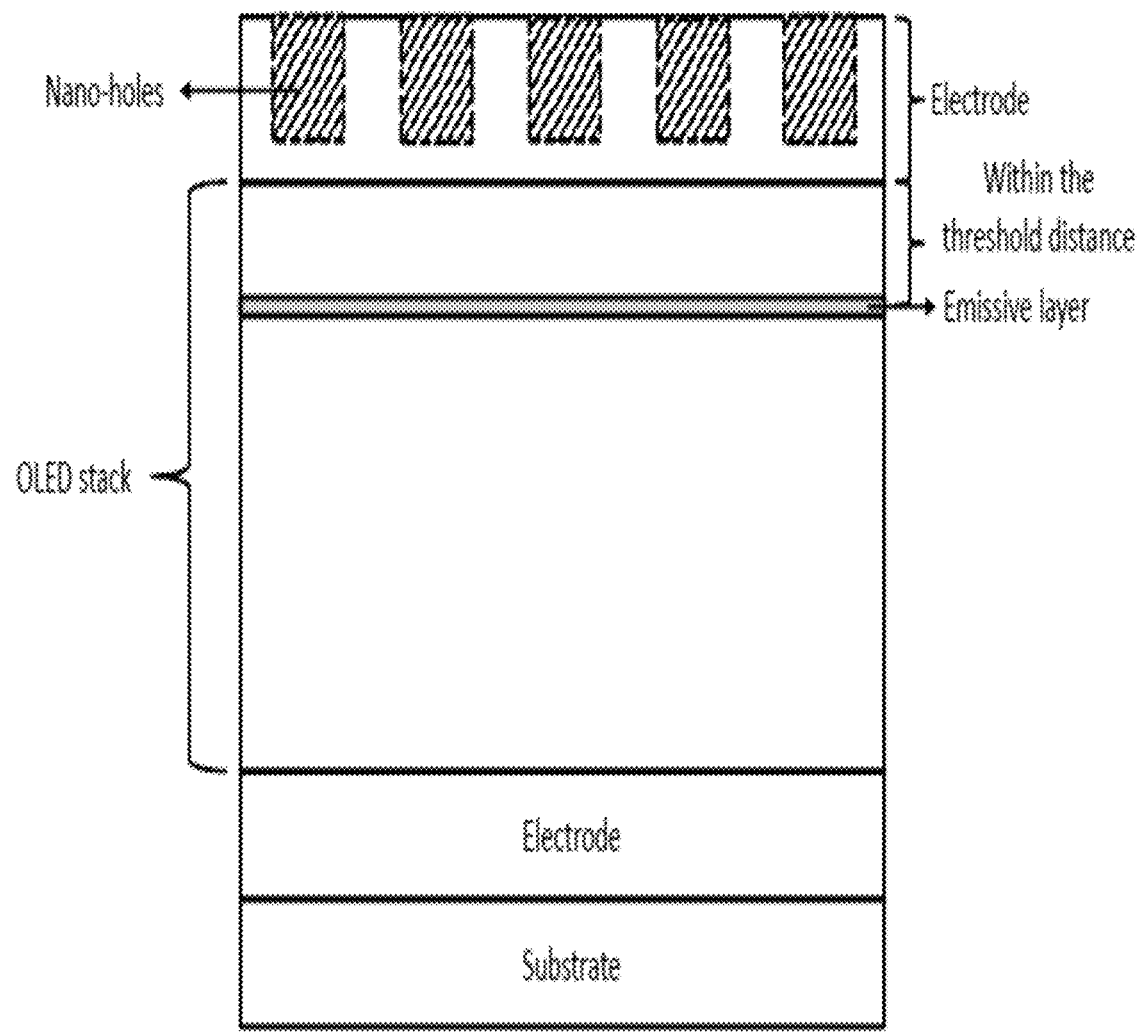
Figure 3E:
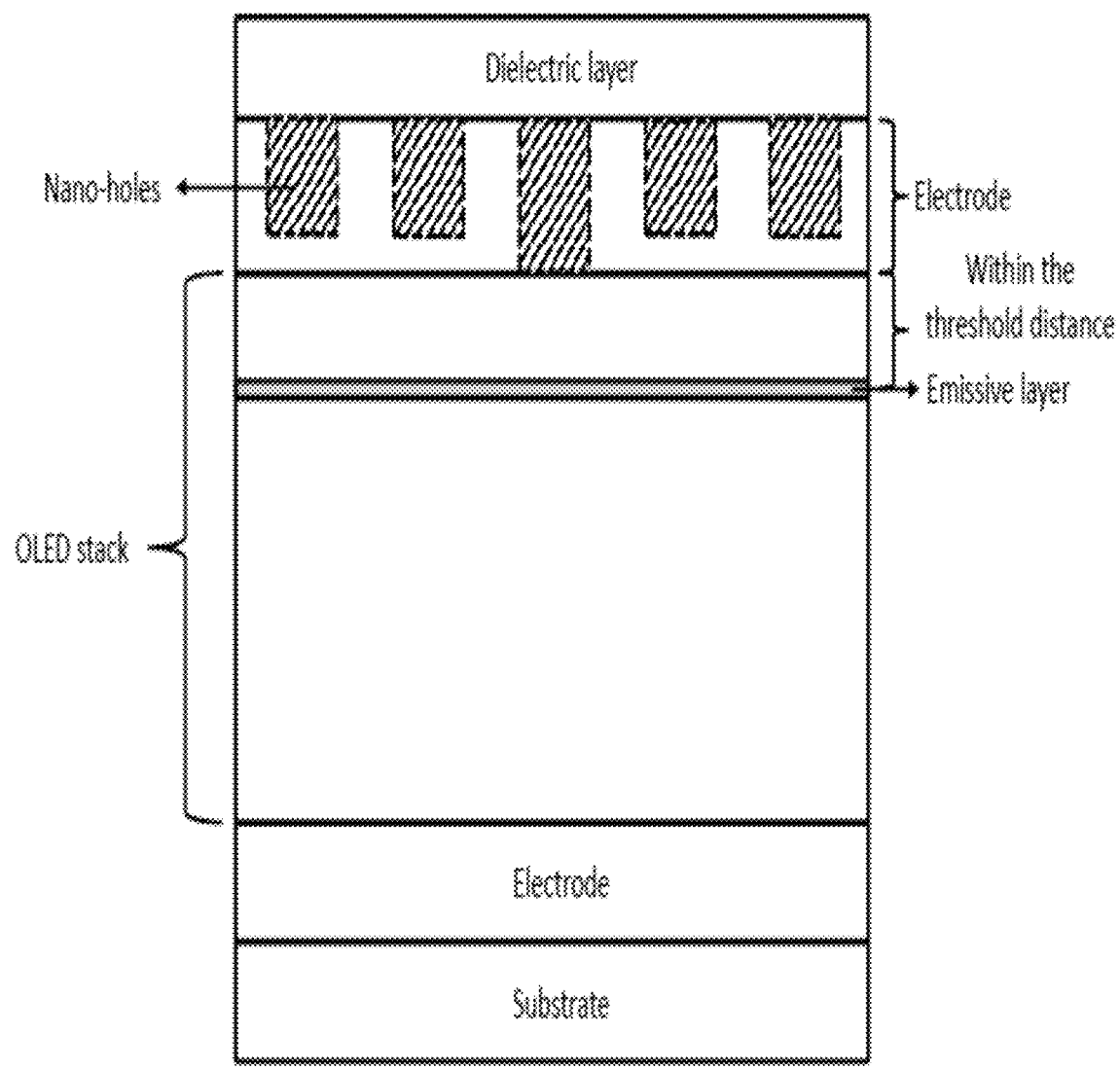
Figure 3F:
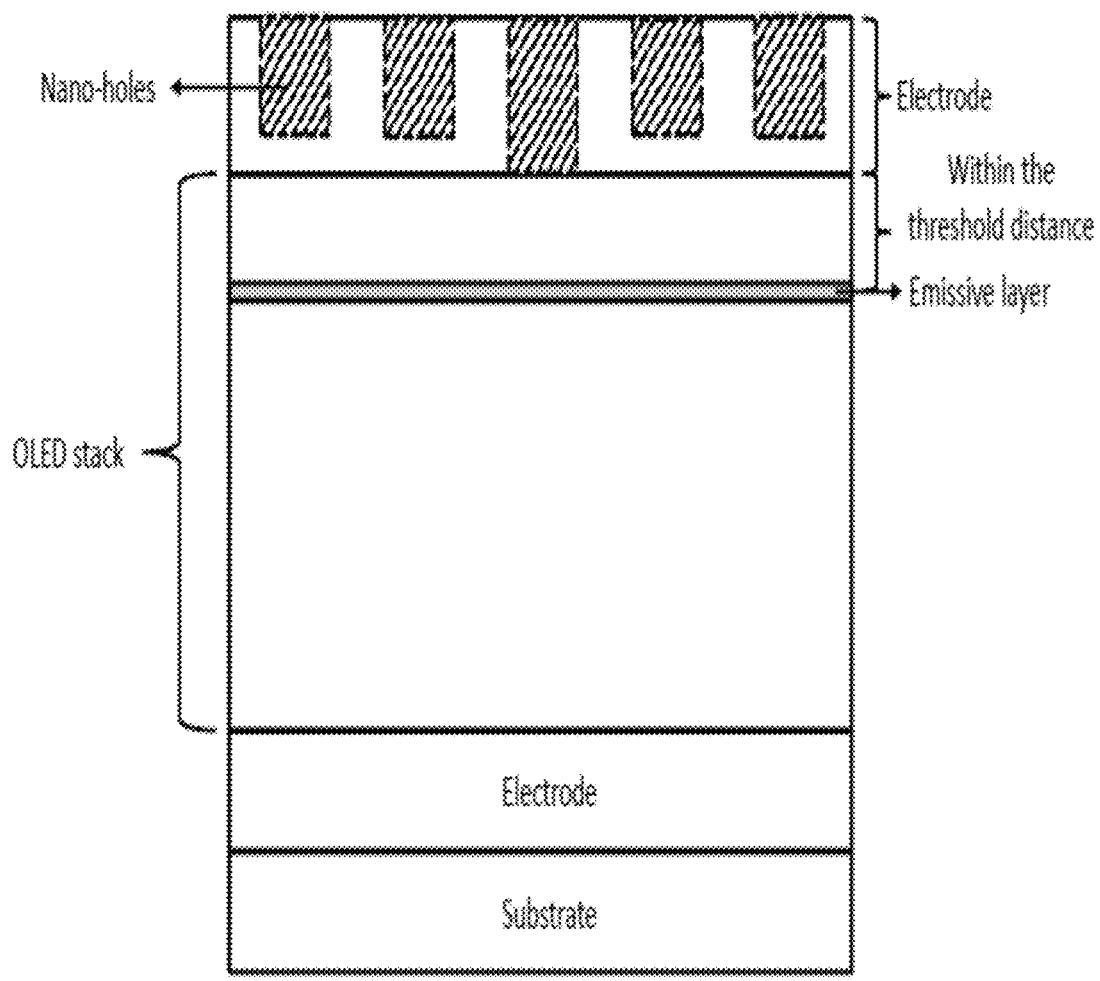

The example devices in FIGS. 3A-3F show variations of the nanostructured cathode, in a cross-section view. These nanostructures include nano-holes that may be etched all the way through the metal film (e.g., as shown in FIGS. 3A-3B), partially through the metal film (e.g., as shown in FIGS. 3C-3D), or where some holes may be etched fully through the metal film while others are only partially etched (e.g., as shown in FIGS. 3E-3F). FIGS. 3A-3F show variations in which the nanostructured cathode may be capped with a dielectric layer (e.g., as shown in FIG. 3A, FIG. 3C, FIG.

3E) or without a dielectric layer (e.g., as shown in FIGS. 3B, 3D, 3F) for matching the refractive index to that beneath the cathode to improve cross-coupling of the surface plasmon mode across the metal film's thickness (e.g., the thickness of an electrode layer). The profile of the hole, i.e., whether the hole edge and/or sidewall may be perpendicular to the film's surface or if the sidewall of the hole has a radius of curvature, may be used to tune the properties of the nanostructured array.

The nanostructures may be made of metals, dielectrics, or some combination of these. The use of composites (e.g., a metal and a dielectric) may provide flexibility in the device design, as a resonant frequency of a localized mode may be tuned and/or selected by the composite used. For each of these material, the localized electromagnetic mode may be tuned. Typical metals that may be used include, but are not limited to: Ag, Al, Au, Ir, Pt, Ni, Cu, W, Ta, Fe, Cr, Mg, Ga, Rh, Ti, Ru, Pd, In, Bi, and/or Ca. In some embodiments, stacks and/or alloys of these materials may be used. Dielectrics used may include, but are not limited to: organic material, titania, silicon dioxide, silicon nitride, aluminum oxide, zinc oxide, nickel oxide, germanium oxide, lithium fluoride, magnesium fluoride, and/or molybdenum oxide.

The localized electromagnetic resonance of a nanostructure or a portion of the nanostructure may be tuned by a shape of the nanostructure. The shape may include any cylindrical, spherical, and/or cubic shape, or any shape that has single or multiple localized resonances. A radius of curvature for edges and/or corners in faceted nanostructures may be used to tune the resonant frequency of the nanostructure. Examples of some multiple-localized-resonance shapes may include ellipses and rectangles that support multiple modes with different frequencies induced by the asymmetry of the nanostructure. For example, differing length and/or width of a rectangular nanostructure may result in two distinct resonant frequencies. These multiple-frequency nanostructures may provide enhanced outcoupling for multi-wavelength or white emission OLEDs.

That is, the embodiments of the disclosed subject matter as shown in FIGS. 3A-3F may include a device having one or more organic layers that may include an emissive layer. A first electrode layer may be disposed over the one or more organic layers, and a plurality of nanostructures may be formed as part of the first electrode layer. The device may include a substrate and a second electrode layer, where the second electrode layer may be disposed on the substrate, the one or more organic layers may be disposed on the second electrode layer, and the first electrode layer including the plurality of nanostructures is disposed on the one or more organic layers and within the predetermined threshold distance of the emissive layer.

As shown in FIG. 3B the plurality of nanostructures may be nanoholes through a thickness of the first electrode layer. As shown in FIG. 3A, the device may include a dielectric layer, where the dielectric layer is disposed on the first electrode layer including the plurality of nanostructures. The dielectric layer may be one of organic, titania, silicon dioxide, silicon nitride, aluminum oxide, zinc oxide, nickel oxide, germanium oxide, lithium fluoride, magnesium fluoride, and/or molybdenum oxide. FIG. 3D shows that the plurality of nanostructures may be nanoholes having a predetermined depth that is less than a thickness of the first electrode layer. FIG. 3C shows that the device includes a dielectric layer, where the dielectric layer may be disposed on the first electrode layer including the plurality of nanostructures. FIG. 3F shows that the plurality of nanostructures may be nanoholes, where one or more of the nanoholes are through a thickness of the first electrode layer, and the other nanoholes have a predetermined depth that is less than a thickness of the first electrode layer. FIG. 3E shows that the device may include a dielectric layer, where the dielectric layer may be disposed on the first electrode layer including the plurality of nanostructures.

In addition to the localized resonance of the individual nanostructures, arranging the nanostructures into periodic, quasi-periodic, or aperiodic arrays may provide electromagnetic modes arising from the electromagnetic coupling between the individual nanostructures. Periodic arrays may provide hybridization between the local modes of the nanostructures and the diffraction modes arising from the periodic arrangement. When arranged in an array, the pitch may range from 100 nm to 1 µm. Examples of various periodic arrays, ranging from a simple square mesh to more complex geometries such as a hexagonal mesh, are shown in FIGS. 4A-4H. Each node of the mesh may include an individual nanostructure or a grouping of nanostructures with a distinct periodicity and/or spacing, including, but not limited to, square arrays, hexagonal arrays, quasi-periodic, or random arrays. Such an arrangement provides a mesh-of-a-mesh, where the primary and secondary meshes need not have the same geometry.

Each of the nano-holes in the nanostructured cathode may be arranged in a particular geometry, as shown in 4A-4H (top-down view), which may include periodic arrays, quasi-periodic arrays, or aperiodic arrays, including random arrangement. Each node of the mesh may include an individual nano-hole or a grouping of nano-holes with a distinct periodicity and/or spacing, including, but not limited to, square arrays, hexagonal arrays, quasi-periodic, or random arrays. This may provide a mesh-of-a-mesh where the primary and secondary meshes need not possess the same geometry.

Complex lattice geometries may provide exotic band dispersions such as flat bands, which may provide enhancing light-matter interactions, or bands with positive or negative curvature. Changing a fill factor of a grating along any dimension (e.g., in the x, y, or z directions) may be used to tune the hybrid mode frequency. A quasi-periodic arrangement of the nanostructures may provide a broadband optical response or multi-wavelength. This arrangement may be desirable for use with white OLEDs and/or multi-wavelength emitters. A random arrangement of nanostructures may be used where simpler and more-scalable fabrication methods such as spin coating are used. Such random or aperiodic arrays of nanostructures may be achieved by depositing a metal film under growth conditions that favor metal dewetting to form islands that can act as nanostructures.

In general, the size of the nanostructure may be used to tune the resonant plasmon frequency, with larger nanostructures or portions of the nanostructure, in general, resonating at lower energies than smaller nanostructures or smaller portions of the nanostructure, all else being equal. Typical nanostructure sizes may have a smallest dimension in the range of 5 nm to 400 nm. The refractive index of the nanostructure or portion of the nanostructure itself and its surrounding environment can be used to tune the resonant mode frequency. When nanostructures included in a lattice, the overall optical response of the array can be made reconfigurable by using a medium whose refractive index (dielectric constant) may be tuned on-demand through external stimuli. For example, liquid crystals or phase-change materials may be used to provide the tuning.

Figure 5:
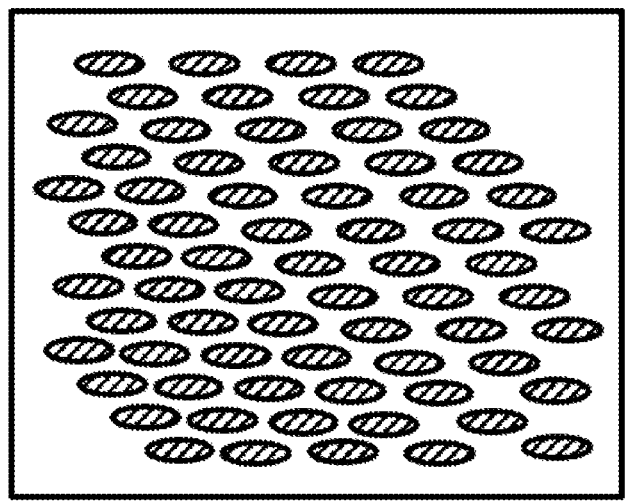
FIG. 5 shows an example nanostructure array for a far-field radiation pattern, having a linear polarization of the far-field radiation according to an embodiment of the disclosed subject matter.

When using the same nanostructures used for Purcell enhancement and out-coupling, the phase front of the emanating wave from the OLED may be reduced and/or eliminated. This may be achieved by having subwavelength-sized nanostructures impart different phases to the light output from the OLED. By applying the Huygens principle, each of these nanostructures may be configured to act as a point scatterer, and the overall phase the nanostructures induce may be controlled by their shape and refractive index. For example, OLEDs with specific linear polarization output may be configured using a nanostructure pattern such as shown in FIG. 5. OLEDs with more complex phase fronts, such as light with a singularity in the center or circular polarization, may be configured through the arrangement of the nanostructures. As discussed above, the structure may be tunable for different wavelengths or for beam steering by controlling the refractive index of the surrounding medium either by using materials such as liquid crystals or phase-change materials.

The phase front of an emanating wave from the OLED may be adjusted by arranging and/or forming the subwavelength-sized nano-holes to impart different phases to the light coming out of the OLED, as described in detail above and shown in FIG. 5.

Figure 6A:
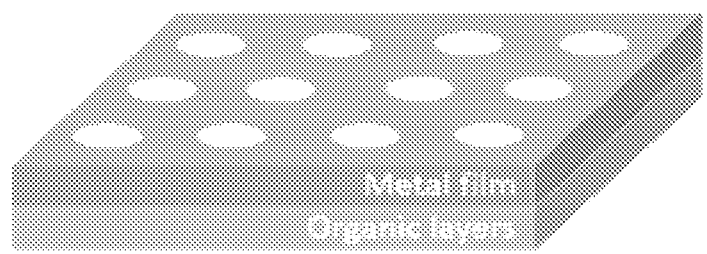
FIGS. 6A-6B show a periodic, random, or quasi-periodic array of holes in a metal film (FIG. 6A), or a through-hole in a metal film surrounded by a bullseye grating structure (FIG. 6B) according to embodiments of the disclosed subject matter.
Figure 6B:
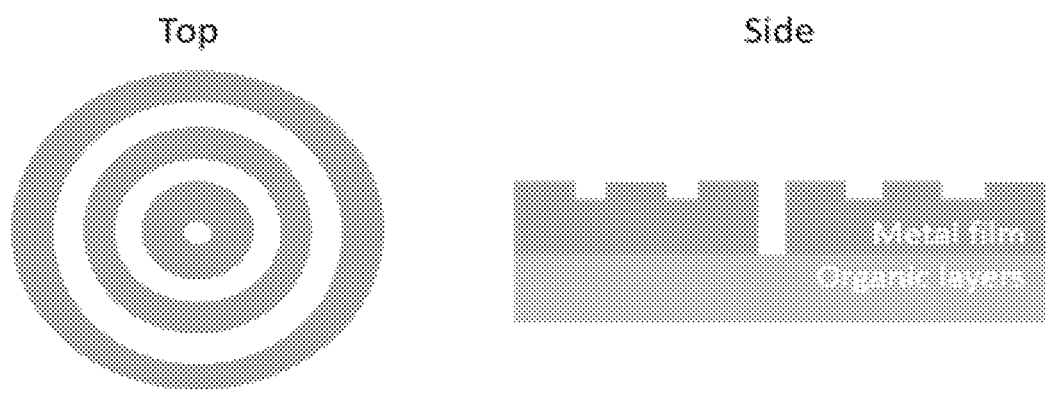

Surface plasmon polaritons (SPP) may couple efficiently to vertically oriented dipoles due to the orientation of their respective electric fields. Horizontal dipoles typically do not couple effectively to surface plasmons, which may limit the SPP-based emission rate enhancement arrangements to vertically-oriented dipoles. At least two different plasmonic structures may overcome this limitation. As shown in FIGS. 6A-6B, these structures may include: a periodic, random, or quasi-periodic array of holes in the metal film (FIG. 6A); or a through-hole in the metal film surrounded by a bullseye grating structure (FIG. 6B). These structures may rely on the resonance created by the electromagnetic modes in the through-holes that couples to the propagating surface plasmons of the film on the top surface. In the case of hole arrays (shown in FIG. 6A), the array may be a grating for out-coupling the surface plasmon energy as light. In FIG. 6B, the bulls-eye grating may provide an out-coupling function, while the through-hole sets the resonance of the electromagnetic mode.

That is, FIGS. 3A-6B show embodiments of a device that includes an emissive layer, and a first electrode layer disposed over one or more organic layers. A plurality of nanostructures may be formed as part of the first electrode layer. The device may include a substrate and a second electrode layer. The second electrode layer may be disposed on the substrate, the one or more organic layers are disposed on the second electrode layer, and the first electrode layer including the plurality of nanostructures is disposed on the one or more organic layers and within the predetermined threshold distance of the emissive layer. At least a portion of the first electrode layer may be at least one of Ag, Al, Au, Ir, Pt, Ni, Cu, W, Ta, Fe, Cr, Mg, Ga, Rh, Ti, Ru, Pd, In, Bi, and/or Ca. These may be included in an alloy, a mixture, and/or a stack in a portion of the first electrode layer. At least a portion of the second electrode layer is at least one selected from the group consisting of: Ag, Al, Au, Ir, Pt, Ni, Cu, W, Ta, Fe, Cr, Mg, Ga, Rh, Ti, Ru, Pd, In, Bi, Ca, titania, silicon dioxide, silicon nitride, aluminum oxide, zinc oxide, nickel oxide, germanium oxide, lithium fluoride, molybdenum oxide, and/or a transparent conducting oxide.

The plurality of nanostructures of the device may include at least one of a periodic array of holes, a random array of holes, and a quasi-periodic array of holes in the first electrode layer. The plurality of nanostructures may be configured such that resonance generated by electromagnetic modes in the holes couples to propagating surface plasmons of the first electrode layer.

The plurality of nanostructures of the device may include an array of holes which provides a grating for out-coupling surface plasmon energy as light. The surface plasmon modes couple to dipole moments that are within 30 degrees of parallel to a plane of the first electrode layer. The surface plasmon modes of the plurality of nanostructures on the first electrode layer may couple to a dipole of the emitting layer that is oriented parallel to the first electrode layer. In some embodiments, the surface plasmon modes may couple to dipole moments that are within 10 degrees of parallel to a plane of the first electrode layer.

The plurality of nanostructures on the device may include a through hole in the first electrode layer, surrounded by a concentric ring grating structure. The concentric ring grating structure may provide an out-coupling, and the through hole may set a resonance of an electromagnetic mode to.

In some embodiments, the plurality of nanostructures of the device may include at least one through hole in the first electrode layer. The plurality of nanostructures may be etched on the first electrode layer, and have an etch depth in the range of 1 nm to a thickness of the first electrode layer. In some embodiments, the plurality of nanostructures comprise at least one selected from the group consisting of: metals, semiconductors, and dielectrics. A radius of curvature in an x, y, or z direction of a shape of the plurality of nanostructures of the device may tune a resonant frequency of the nanostructures.

The plurality of nanostructures are disposed in an array arrangement may be selected from the group consisting of: periodic arrays, quasi-periodic arrays, and aperiodic arrays to form electromagnetic modes arising from the electromagnetic coupling between the individual nanostructures. When the plurality of nanostructures are in the array arrangement, a pitch may range from 100 nm to 1 μm. The periodic array may be a square mesh, a hexagonal mesh, a triangular mesh, and/or a one-dimensional grating. Nodes of the mesh may include an individual nanostructure or a grouping of nanostructures having a predetermined spacing of square arrays, hexagonal arrays, quasi-periodic, and/or random arrays. The plurality of nanostructures in the aperiodic arrays may have a random arrangement. In some embodiments, a size of each of the plurality of nanostructures may be 5 nm to 400 nm. In some embodiments, a refractive index surrounding the first electrode of the device may be adjustable by including liquid crystals or phase-changing materials.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   one or more organic layers that include an emissive layer;
   a first electrode layer disposed over the one or more organic layers;
   a plurality of nanostructures formed as part of the first electrode layer;

a substrate; and a second electrode layer, wherein the second electrode layer is disposed on the substrate, the one or more organic layers are disposed on the second electrode layer, and the first electrode layer including the plurality of nanostructures is disposed on the one or more organic layers and within a predetermined threshold distance of the emissive layer, which is a distance at which a total non-radiative decay rate constant is equal to a total radiative decay rate constant, and wherein at least a portion of the second electrode layer is at least one selected from the group consisting of: Ag, Al, Au, Ir, Pt, Ni, Cu, W, Ta, Fe, Cr, Mg, Ga, Rh, Ti, Ru, Pd, In, Bi, Ca, titania, silicon dioxide, silicon nitride, aluminum oxide, zinc oxide, nickel oxide, germanium oxide, lithium fluoride, molybdenum oxide, and a transparent conducting oxide.

2. The device of claim 1, wherein the plurality of nanostructures are nanoholes having a predetermined depth that is less than a thickness of the first electrode layer.

3. The device of claim 1, wherein the plurality of nanostructures includes at least one selected from the group consisting of: a periodic array of holes, a random array of holes, and a quasi-periodic array of holes in the first electrode layer.

4. The device of claim 3, wherein the plurality of nanostructures are configured such that resonance generated by electromagnetic modes in the holes couples to propagating surface plasmons of the first electrode layer.

5. The device of claim 1, wherein surface plasmon modes of the plurality of nanostructures that are part of the first electrode layer couple to a dipole of the emitting layer that is oriented preferentially parallel to the first electrode layer.

6. The device of claim 5, wherein the surface plasmon modes couple to dipole moments that are within 30 degrees of parallel to a plane of the first electrode layer.

7. The device of claim 5, wherein the surface plasmon modes couple to dipole moments that are within 10 degrees of parallel to a plane of the first electrode layer.

8. The device of claim 1, wherein the plurality of nanostructures includes a through hole in the first electrode layer, surrounded by a concentric ring grating structure.

9. The device of claim 8, wherein the concentric ring grating structure provides an out-coupling and the through hole sets a resonance of an electromagnetic mode.

10. The device of claim 1, wherein the plurality of nanostructures are etched to be part of the first electrode layer, and have an etch depth in the range of 1 nm to a thickness of the first electrode layer.

11. The device of claim 1, wherein a radius of curvature in an x, y, or z direction of a shape of the plurality of nanostructures tunes a resonant frequency of the nanostructures.

12. The device of claim 1, wherein the plurality of nanostructures are disposed in an array arrangement selected from the group consisting of: periodic arrays, quasi-periodic arrays, and aperiodic arrays to form electromagnetic modes arising from the electromagnetic coupling between the individual nanostructures.

13. The device of claim 12, wherein when the plurality of nanostructures are in the array arrangement, a pitch ranges from 100 nm to 1 µm.

14. The device of claim 12, wherein the periodic array is selected from the group consisting of: a square mesh, a hexagonal mesh, a triangular mesh, and a one-dimensional grating.

15. The device of claim 14, wherein nodes of the mesh include an individual nanostructure or a grouping of nanostructures having a predetermined spacing selected from the group consisting of: square arrays, hexagonal arrays, quasi-periodic, and random arrays.

16. The device of claim 1, wherein the plurality of nanoparticles are selected from the a shape of cylindrical, spherical, cubic, ellipses, and/or rectangles.

17. The device of claim 1, wherein the shape of the plurality of nanoparticles has multiple localized resonances.

18. The device of claim 1, wherein at least one organic layer of the one or more organic layers includes a delayed fluorescent emitter.

19. The device of claim 1, wherein the device emits singly linearly polarized light or circularly polarized light.

* * * * *